(12) United States Patent
Kalatizadeh

(10) Patent No.: US 7,872,576 B2
(45) Date of Patent: Jan. 18, 2011

(54) SWITCHING DEVICE AND METHOD

(76) Inventor: Andreh Kalatizadeh, 125-10 Queens Blvd., Suite 804, Kew Gardens, NY (US) 11415

( * ) Notice: Subject to any disclaimer, the term of this patent is extended or adjusted under 35 U.S.C. 154(b) by 472 days.

(21) Appl. No.: 11/965,450

(22) Filed: Dec. 27, 2007

(65) Prior Publication Data

US 2009/0167098 A1  Jul. 2, 2009

(51) Int. Cl.
*G08B 21/00* (2006.01)
(52) U.S. Cl. .............. 340/540; 340/10.1; 340/10.2; 340/572.1; 340/870.16; 307/112; 307/116; 708/250; 455/39; 455/26.1; 455/73; 455/91
(58) Field of Classification Search .......... 340/540, 340/10.1, 10.2, 572.1, 870.16; 307/112–117; 370/328, 347; 368/10; 455/41.2, 39, 26.1, 455/73, 91, 115.1, 115.2; 708/250
See application file for complete search history.

(56) References Cited

U.S. PATENT DOCUMENTS

| | | | |
|---|---|---|---|
| 3,980,980 A | 9/1976 | Zioni et al. | |
| 4,031,435 A | 6/1977 | Zioni et al. | |
| 4,375,583 A | 3/1983 | Halperin et al. | |
| 5,808,278 A | 9/1998 | Moon et al. | |
| 5,917,392 A | 6/1999 | Finfera | |
| 6,066,837 A | 5/2000 | McCormick et al. | |
| 6,307,812 B1 * | 10/2001 | Gzybowski et al. | 368/10 |
| 6,703,591 B2 | 3/2004 | Daum et al. | |
| 2006/0034208 A1 * | 2/2006 | Blouin | 370/328 |
| 2006/0180179 A1 | 8/2006 | Roderer et al. | |
| 2007/0103887 A1 | 5/2007 | Bleier et al. | |
| 2007/0261561 A1 | 11/2007 | Grossbach et al. | |

* cited by examiner

*Primary Examiner*—George A Bugg
*Assistant Examiner*—Sisay Yacob
(74) *Attorney, Agent, or Firm*—Jonathan M. Sharret

(57) ABSTRACT

Embodiments of the present invention are directed to a method and device for operating a circuit. In particular, embodiments of the present invention are directed to a method and device that may allow an observant Jew to operate a circuit on the Sabbath or on the Jewish holidays. Embodiments of the present invention may include a combination of mitigating factors which may allow an observant Jew to operate a circuit on the Sabbath or on a Jewish holiday.

40 Claims, 11 Drawing Sheets

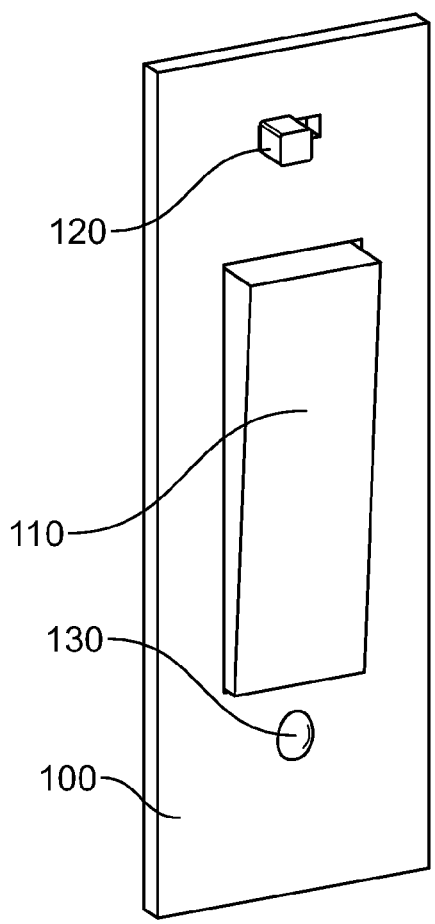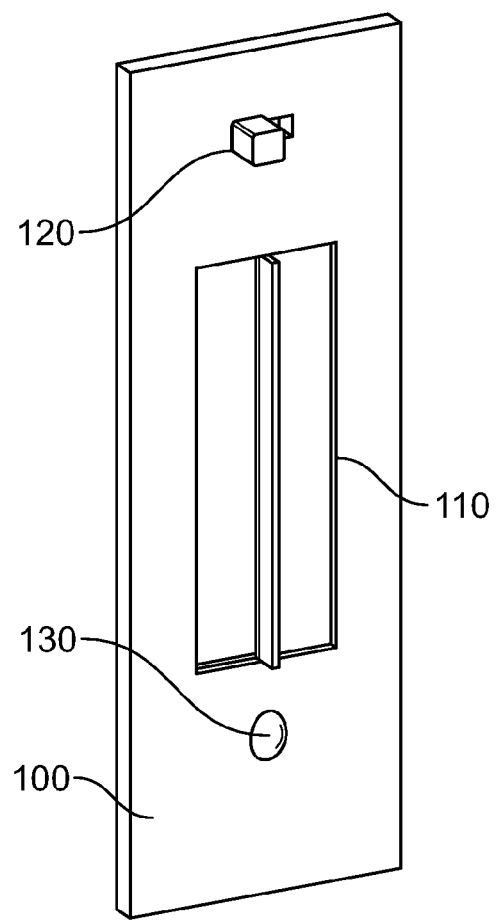
FIG. 1     FIG. 2

SWITCHING DEVICE AND METHOD

BACKGROUND OF THE INVENTION

1. Field of the Invention

The present invention relates to a method and device for operating a circuit. In particular, the present invention relates to a method and device that may allow an observant Jew to operate a circuit on the Sabbath or on the Jewish holidays.

2. Description of the Related Art

Observant Jews are prohibited by Halacha (the code of Jewish laws) from performing certain activities on the Sabbath and on the Jewish holidays. One of these prohibited activities is the use of electrical devices.

In Halacha certain mitigating factors may turn a prohibited act into a permitted act or may lessen the degree of violation. For example, it is generally permitted for a person to set into motion an autonomous process before the Sabbath begins that will later perform a prohibited action on the Sabbath itself. From this example, two important principles are learned. Firstly, that starting an autonomous process before the Sabbath or a Jewish holiday begins is permitted even though it causes a prohibited action to be performed later on the Sabbath or holiday itself. Secondly, one is only held liable for actions that one actually performs on the Sabbath or holiday, not the actions performed on one's behalf by an autonomous process or an object which acts automatically. Thus, one may set a timer before the Sabbath to turn on or to turn off lights on the Sabbath. Similarly, one may turn on a dishwasher right before the Sabbath even though it continues to operate on the Sabbath.

Another mitigating factor is whether there is a direct causal link between an initial act and its ultimate result. In other words, if A causes B and B causes C, there may be an indirect causal link between A and C. Another mitigating factor is whether there is a delay between an initial action and its ultimate result. Another mitigating factor is whether a person intends for a final result to occur when committing an initial act. Another mitigating factor is the certainty or probability with which an initial action will lead to its ultimate result.

Although the use of a timer may add a certain degree of flexibility, this is not an ideal solution. One must decide in advance what times the timer will operate the circuit. These times cannot be changed once the Sabbath has begun.

The present invention is directed to a method and device which incorporates one or more mitigating factors thereby allowing an observant Jew to operate a circuit on the Sabbath and on Jewish holidays.

SUMMARY OF THE INVENTION

In an embodiment of the present invention a method for operating a circuit may include a step of attempting a first transmission from a first transmitter to a first receiver after a first delay. The method may further include the step of determining if the first transmission is successful, wherein the first transmission is successful if a first preventive element does not prevent the first transmission. The method may further include the step of selecting a variable at random from between a first value and a second value. The method may further include the step of determining if the variable is above a predetermined threshold. The method may further include the step of operating the circuit if the variable is above the threshold.

In an embodiment of the present invention a device for operating a circuit may include a first transmitter. The device may further include a first receiver for receiving a first transmission from said first transmitter. The device may further include a first preventive element adapted to selectively prevent the first transmission. The device may further include a first random number generator for selecting a variable at random from between a first value and a second value. The device may further include a processor operably coupled to the first transmitter and the first receiver for attempting the first transmission from the first transmitter to the first receiver after a first delay and for determining if the first transmission is successful and for determining if the variable is above a predetermined threshold, wherein the first transmission is successful if the first preventive element does not prevent the first transmission. The device may further include a switch operably coupled to the processor for operating the circuit if the variable is above said threshold.

In an embodiment of the present invention a method for operating a circuit may include a step of attempting a transmission to a receiver after a first delay, wherein the first delay is selected at random from between a first value and a second value. The method may further include the step of determining if the transmission is successful, wherein the transmission is successful if the transmission is received by the receiver. The method may further include the step of operating the circuit if the transmission satisfies a predetermined condition.

In an embodiment of the present invention a device for operating a circuit may include a receiver for receiving a transmission. The device may further include a processor operably coupled to the receiver for attempting the transmission to the receiver after a first delay and for determining if the transmission is successful, wherein the transmission is successful if the transmission is received by the receiver. The device may further include a first random number generator for selecting the first delay at random from between a first value and a second value. The device may further include a switch operably coupled to the processor for operating the circuit if the transmission satisfies a predetermined condition.

BRIEF DESCRIPTION OF THE DRAWINGS

Embodiments of the invention will be understood and appreciated more fully from the following detailed description in conjunction with the figures, which are not to scale, in which like reference numerals indicate corresponding, analogous or similar elements, and in which:

FIG. 1 shows an embodiment of the present invention in which the device is a wall switch having a rocker switch;

FIG. 2 shows an embodiment of the present invention in which the device is a wall switch having a sliding door;

DESCRIPTION OF THE PREFERRED EMBODIMENT

Figure 3:
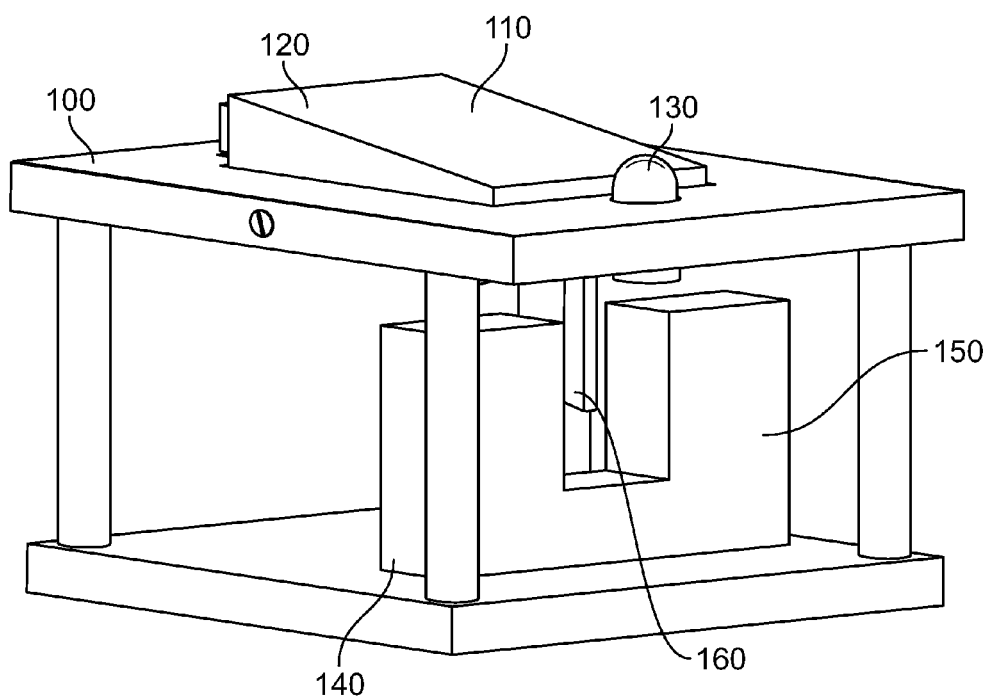
FIG. 3 shows a cutaway, perspective view from the side of an embodiment of the present invention shown in FIG. 1.

Embodiments of the present invention relate to a method and device for the operation of a circuit including a combination of mitigating factors which may allow an observant Jew to operate a circuit on the Sabbath or on a Jewish holiday. However, it is to be understood that the present invention may be useful in other applications as well. As an example, the operation of a circuit being probabilistically or indirectly related to a user's actions may be useful in situations where the uncertainty of an outcome or the achievement of this outcome in an indirect manner is desirable such as in a children's game. Other examples include indirect discontinuation of life support for terminally ill patients, indirect triggering of a lethal dose in a death sentence, indirect discharging of a weapon, or situations where a religion places restrictions on the operation of a circuit.

The word "operating" as used herein with respect to a circuit refers to the opening of the circuit, the closing of the circuit, or sending a signal over the circuit. The word "circuit" as used herein refers to a device which transmits energy from one point to another. For example, the energy may be any electromagnetic or acoustic energy. An example of an electric circuit is a closed loop of electrical elements which allows for a current to flow through the circuit. As is well known in the art, an electrical circuit may also allow for a voltage between two points. Although embodiments of the present invention are described in terms of electrical circuits, the present invention embraces all types of circuits.

The word "opening" as used herein with respect to a circuit refers to an action which prevents or continues the prevention of an operable amount of energy from flowing from a source to a destination in a circuit. The word "closing" as used herein with respect to a circuit refers to an action which allows or continues the allowance of an operable amount of energy to flow from a source to a destination in a circuit. For example, in an electrical circuit, a standard single pole, single throw switch may be used to open or close a circuit by physically separating or connecting two parts of a circuit, thereby preventing a current from flowing through the circuit or allowing a current to flow through the circuit. Alternatively, a circuit may be opened by introducing a high impedance path in a circuit that effectively prevents an operable current from flowing through the circuit. The circuit may be closed by lowering the impedance of a path in a circuit to allow an operable current to flow through the circuit. In a fiber optic circuit, for example, opening the circuit may refer to preventing laser light from reaching a destination and closing the circuit may refer to allowing laser light to reach a destination. If a circuit is already open, deciding to leave the circuit open is considered opening the circuit and if a circuit is already closed, deciding to leave the circuit closed is considered closing the circuit.

The words "sending a signal" as used herein with respect to a circuit refer to an action which controls the degree or type of energy flowing from a source to a destination in a circuit. For example, in an electrical circuit, sending a signal may refer to modifying a frequency, a phase, a voltage, a current or any other property of an electrical signal in the circuit. In an electrical circuit, sending a signal may also refer to sending an analog or a digital signal.

Embodiments of the present invention may be used anywhere it is desirable to operate a circuit. For example, an embodiment of the present invention may be a wall switch, a lamp switch, a switch for an appliance, a remote control, a wall outlet, a power strip, or a device which plugs into a standard wall outlet and serves as a substitute wall outlet. Embodiments of the present invention may also be integrated into key lifestyle devices and appliances such as air conditioners, dishwashers, ovens, hotplates, coffee urns, thermostats, elevator call and floor selection buttons, motion detectors, alarm activator/deactivator, hotel door controls, etc.

FIGS. 1-2 show embodiments of the present invention in which the device is a wall switch 100. The wall switch may be used to open or close a circuit, for example one which turns on or turns off a light in a room. The wall switch may have an operator 110 which may be used to indirectly operate the circuit. The operator may be a device which moves between a first position and a second position such as, for example, a rocker switch as is shown in FIG. 1 or a knob on a sliding door as is shown in FIG. 2. The operator may also be a rotatable knob or a knob capable of sliding between a first position and a second position such as those found on standard dimmer switches.

The switch may also have a selector 120 which switches operation of the wall switch between a first mode usable for Sabbath and Jewish holidays and a second mode ("normal" mode) usable at other times. The selector may be a manual switch or may be a processor-controlled element. If the selector is manual, the selector may be coverable, difficult to operate, or capable of being made temporarily non-operable in order to prevent the accidental switching of the selector. If the selector is processor-controlled, the processor may automatically switch the mode based on a preprogrammed schedule, based on a calendar, based on a received clock, or based on a received global position. Alternatively, the selector may allow for the user to manually select from a Sabbath and Jewish holiday mode, a "normal" mode, and an automatic, processor-controlled mode, in which the processor decides the operating mode of the device, as detailed above.

The switch may also have a warning indicator 130 which may warn a user of the wall switch when use of the wall switch is permissible or prohibited on the Sabbath or Jewish holidays. The warning indicator may be visible or audible, for example, an illuminated green light emitting diode when use of the wall switch is permissible and an illuminated red light emitting diode when use of the operator is prohibited. The warning indicator may switch to a warning state when the device is in "normal" mode to prevent accidental usage on the Sabbath or on a Jewish holiday. The warning indicator may also make operation of the device impossible or difficult when use of the device is not permissible on the Sabbath. For example, the warning indicator may lock the position of the operator. The warning indicator may also indicate error conditions in the device or indicate a status of the device.

Figure 4:
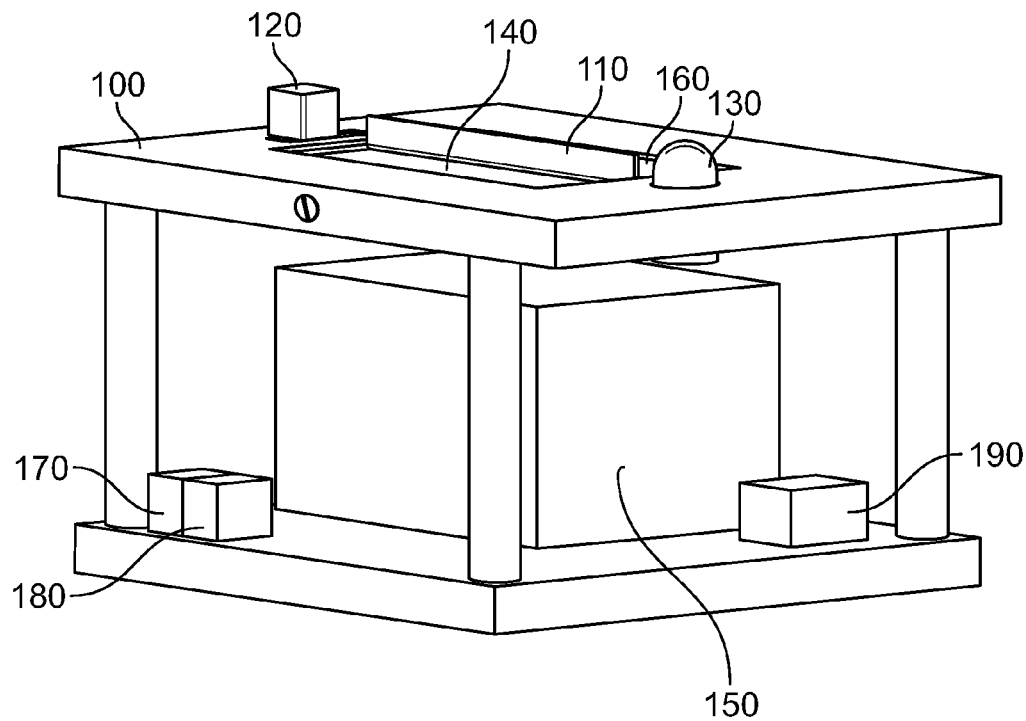
FIG. 4 shows a cutaway, perspective view from the side of an embodiment of the present invention shown in FIG. 2.
Figure 5:
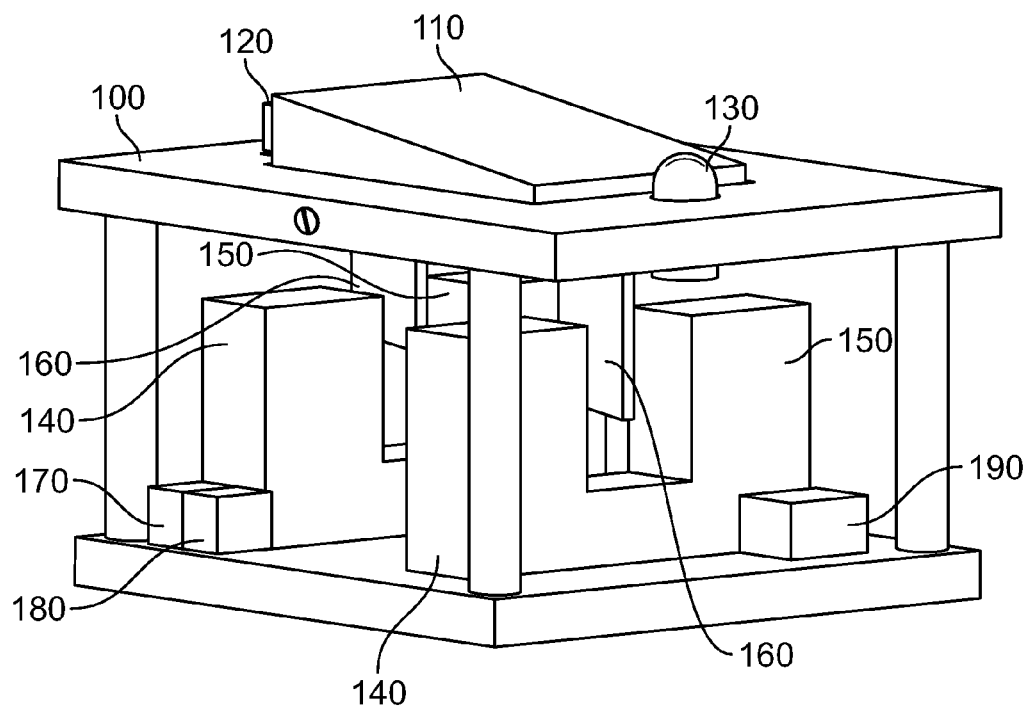
FIG. 5 shows a cutaway, perspective view from the side of an embodiment of the present invention in which the device is a wall switch having two pairs, wherein each pair consists of a transmitter positioned opposite a receiver and each pair has a preventive element therebetween.

FIGS. 3-5 show a cutaway, perspective view from the side of the embodiments of the present invention shown in FIGS. 1-2 unattached to a wall. The wall switch may have one or more transmitters 140 and may have one or more receivers 150.

A "transmitter" is any device which transmits a transmission either passively or actively. A "receiver" is any device which receives a transmission either passively or actively. It should be noted, that a transmitter does not have to be the original source of the transmission, it is sufficient that the transmitter be capable of conveying the transmission to a receiver. For example, if a transmission is an ambient temperature or an ambient light in a room, a transmitter may be an aperture that allows the ambient temperature or ambient light to pass therethrough to the receiver.

A "transmission" may be anything useful for conveying information. The transmission may be any type of electrical, magnetic, electromagnetic, optical, chemical, mechanical, radiological, thermal, or acoustic signal, or any combination thereof, and may have any property of this type of signal. For example, if the transmission is electromagnetic, the transmission may have a property such as a wavelength, phase, amplitude, or polarity, or any combination thereof, or any other property of an electromagnetic signal. If the signal is mechanical, the transmission may have a property such as a force, a pressure, or any combination thereof, or any other mechanical property.

In embodiments having a pair consisting of a receiver and a transmitter, the receiver may be adapted for receiving a transmission from the transmitter. In embodiments which do not have a transmitter and instead have one or more receivers, the receivers may be adapted for receiving a transmission, for example, from an ambient source. In an embodiment of the present invention which has an active transmitter, the transmitter may be a light emitting diode and a receiver may be a photodetector. In an embodiment which has a passive transmitter, the transmitter may be a luminescent device such as a phosphorescent material and a receiver may be a photodetector. In another embodiment, a transmitter may be an ultrasonic transducer and a receiver may be an ultrasonic detector. In another embodiment, a transmitter may be a heat source and a receiver may be a thermal sensor. In another embodiment, a transmitter may be any mechanical device, such as a pneumatic device, and a receiver may be a pressure sensor.

The wall switch may also have one or more preventive elements 160. A preventive element is a device or a portion of a device capable of preventing a transmission by a transmitter from being received by a receiver. "Preventing" may mean that none of the transmission reaches the receiver, or only that an amount of the transmission below a threshold reaches the receiver, or that none of a property of the transmission reaches the receiver, or that only an amount of the property of the transmission below a threshold reaches the receiver. "Preventing" may be accomplished by either blocking or altering a transmission or, alternatively, by misaligning a transmitter and a receiver so that the transmission is not received. The preventive element may have different properties depending on the transmitter, the receiver, and the type of transmission it is meant to prevent. For example, if the transmission is visible light, the preventive element may be an opaque material. If the transmission is radiological, the preventive element may be a lead shielding. If the transmission is heat, the preventive element may be insulative. In a more complicated example, a transmitter may transmit light having a first range of wavelengths to a receiver adapted to receive light having the first range of wavelengths. In this case, a preventive element may be an object capable of changing light's wavelength (such as a colored reflective surface, a colored transparent material, or a filter, for example) such that light from the object would be received at the receiver having a second range of wavelengths different than the first range of wavelengths.

The preventive element may be moveable from a first position in which it prevents a transmission from a transmitter to a receiver to a second position in which it does not prevent the transmission. The preventive element may be operably connected to the operator 110 such that moving the operator causes the preventive element to transition between its preventive and non-preventive positions. If a transmission is prevented, the transmission is said to be "unsuccessful." If the transmission is not prevented, the transmission is said to be "successful."

The preventive element may remain stationary after it has been moved into a preventive or non-preventive position. For example, if the preventive element is in a preventive position such that a current transmission is prevented, without further user intervention, a subsequent transmission will also be prevented. Alternatively, the preventive element may not remain stationary after it has been moved into its position. For example, if the preventive element is in a preventive position such that a current transmission is prevented, because the preventive element automatically moves to a non-preventive position after a time, a subsequent transmission will not be prevented. The preventive element may move automatically between the preventive and non-preventive positions either after a fixed amount of time, after the state of the circuit is changed, or after another transmission.

It is to be understood that elements of one physical structure may serve more than one function in embodiments of the present invention. For example, an inventive wall switch may have a receiver which is a photodetector and a sliding door which, when open, allows ambient light in the room to reach the photodetector. Elements of the door serve at least three purposes. The aperture of the door is a transmitter since it conveys the transmission, in this case, light, to the receiver. The door itself is a preventive element since it selectively prevents a transmission from reaching the receiver. A knob on the door is an operator since it moves the door between its preventive and non-preventive positions.

It is important to note that the preventive element and operator do not need to be directly connected to any electrical apparatus or any device which cannot be used on the Sabbath or on Jewish holidays. Thus, there may be no direct connection between the preventive element and the operator on the one hand and the circuit that the inventive device is meant to operate on the other hand.

The wall switch may also have a processor 170. The processor may be operably connected to the transmitter and/or the receiver. The processor may be capable of attempting a transmission. The attempted transmission may be from a transmitter to a receiver. Alternatively, the attempted transmission may be to a receiver. "Attempting a transmission" may be any action which provides for a transmitter to generate or convey a transmission. For example, if the transmitter is a light emitting diode, "attempting a transmission" may refer to a processor providing sufficient electrical energy to the diode such that the diode transmits light. "Attempting a transmission" may be any action which provides for a receiver to receive a transmission. For example, if the receiver is a photodetector, "attempting a transmission" may refer to a processor enabling the photodetector such that light incident on the photodetector may be properly received. The processor may be capable of determining whether an attempted transmission was received by a receiver. The processor may be a controller, a microcontroller, a microprocessor, a CPLD, an FPGA, or any similar device for performing this function. The processor may have internal memory storage for storing a set of instructions which, when executed by the processor, results in the processor performing a series of actions. Alternatively, the instructions may be stored in a storage device which may be operably coupled to the processor.

The wall switch may also have one or more random number generators 180. The random number generator may be any device capable of randomly or pseudorandomly selecting a number. The number may be selected based on a probability distribution such as a uniform distribution, a Poisson distribution, a Gaussian distribution, or any other predetermined distribution. The random number may be selected from between a first value and a second value. For example, the random number generator may generate a random number from between 1 and 6 using a uniform distribution. Such a random number generator would approximate the throwing of a six-sided die. Alternatively, the first value and second value may be equal such that the random number generator generates a number equal to the first value with 100% probability. A random number generator may be part of a processor. A random number generator may be based on a random event such as the decay of a radioactive substance. Although reference may be made to more than one random number generator, this is not meant to imply that there is more than one physically distinct structure for generating random numbers. Instead, a single device, such as a processor, may have more than one random number generator in the sense that the processor is capable of generating different random numbers using different ranges and/or probability distributions. The processor 170 may include or be coupled to the random number generator and may be capable of determining whether a number selected by the random number generator is above, below, or equal to a predetermined threshold. The threshold may be either fixed or alterable.

The wall switch may have one or more switch 190. The switch may be any device capable of operating a circuit. The switch may be capable of opening the circuit, closing the circuit, or sending a signal over the circuit. The processor 170 may be capable of controlling the switch and thereby may control the operation of the circuit. The switch may be a transistor, a vacuum tube, a relay, a reed switch, a tilt switch, a proximity switch, or any other type of switch.

Figure 6:
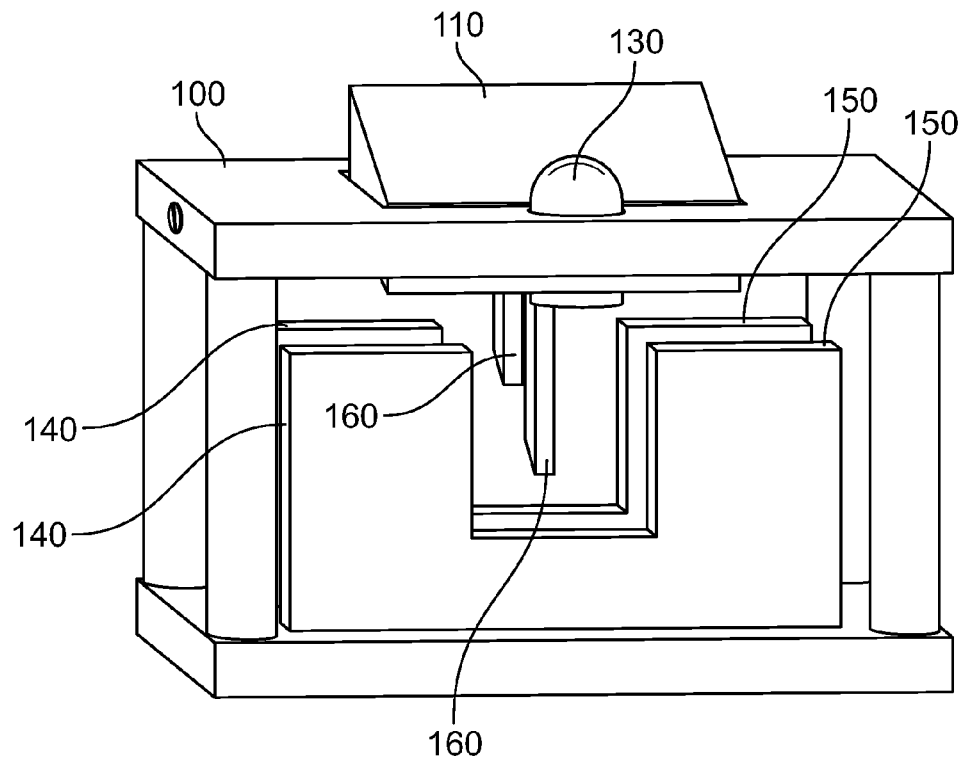
FIG. 6 shows a cutaway, perspective view from the top of the embodiment of the present invention shown in FIG. 5 unattached to a wall.
Figure 7:
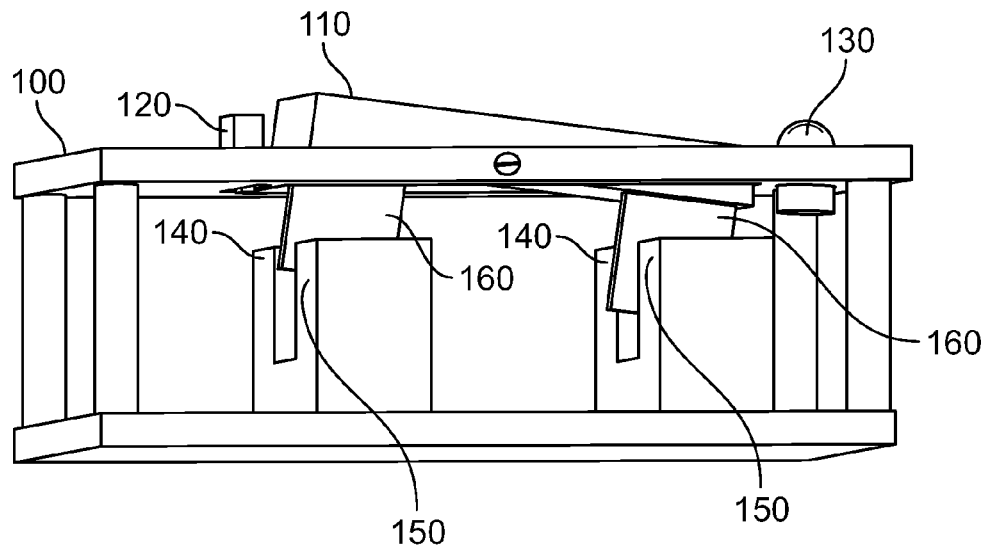
FIG. 7 shows a cutaway, perspective view from the side of the embodiment of the present invention shown in FIG. 5 unattached to a wall.

FIG. 3 shows an embodiment of the present invention including a device having one pair consisting of one transmitter positioned opposite one receiver. FIG. 5 shows an embodiment of the present invention including a device having two pairs, each pair consisting of a transmitter positioned opposite a receiver. Other arrangements of the transmitter and receiver are possible. FIGS. 6-7 show a cutaway, perspective view of the embodiment of the present invention shown in FIG. 5 unattached to a wall. FIGS. 3 and 6-7 show that there is an empty space between each pair of transmitters and receivers. The device may also include a preventive element between each pair capable of being moved by an operator through this empty space to block or not block a transmission between the transmitter and receiver in the pair.

For example, the operator may be a rocker switch having a first preventive element attached to a first side of the rocker switch to prevent or not prevent a first transmission from a first transmitter to a first receiver. The rocker switch may have a second preventive element attached to a second side of the rocker switch to prevent or not prevent a second transmission from a second transmitter to a second receiver. When the first side of the rocker switch is depressed and the second side is elevated, the first preventive element may move into a position in which it prevents the first transmission from the first transmitter to the first receiver. If there is a second preventive element, when the first side is depressed, the second preventive element may move into a position in which it does not prevent the second transmission from the second transmitter to the second receiver. The opposite occurs when the first side is elevated and the second side is depressed.

FIG. 4 shows an embodiment of the present invention including a device having one receiver. The receiver may be adapted to receive an ambient transmission such as light, heat, sound, pressure, or any other ambient signal. The receiver may be operably connected to a processor which may attempt a transmission to the receiver. When a transmission is attempted to the receiver the processor may enable the receiver for a predetermined amount of time so it is capable of receiving a transmission and when a transmission is not attempted the processor may disable the receiver so it is not capable of receiving a transmission.

In such an embodiment, the receiver may be a microphone and the transmission may be ambient noise in a room such as people conversing. If the ambient noise is received by the receiver, then the transmission is successful. Otherwise, the transmission is unsuccessful. However, even if the transmission is successful, the circuit may not be operated unless a predetermined condition is satisfied. The predetermined condition may be that the ambient noise is above a predetermined threshold. The threshold may be a volume level, a length of time above a volume level, or any combination thereof. The predetermined condition may be that the ambient noise has a certain frequency, phase, amplitude, or any combination thereof. The predetermined condition may be a number of consecutive successful or unsuccessful transmissions, a number of successful or unsuccessful transmissions out of a larger number of attempted transmissions, a number of successful or unsuccessful transmissions within a predetermined time period, or any combination thereof. For example, if several consecutive unsuccessful transmissions must occur before the circuit is opened, the circuit will not be opened if there is a brief lull in the conversation.

Embodiments of the device shown in FIG. 4 may also have a transmitter and a preventive element. In such embodiments, the transmitter and/or preventive element may be passive and therefore not controllable by the processor. For example, the transmitter may be an aperture and the preventive element may be a sliding door. Alternatively, the transmitter and/or preventive element may be active and therefore controllable by the processor. For example, the processor may control the transmitter and/or preventive element to, for example, close or open the aperture thereby preventing or not preventing the transmission.

Embodiments of the present invention may require a multiple step process to move the one or more preventive elements into a preventive or non-preventive position. For example, in the embodiment of the invention shown in FIG. 5, there may instead be two operators. Each operator may separately control one of the preventive elements. In such an arrangement, one person may use each operator to move each preventive element. Alternatively, two people may each use one of the operators to move one of the preventive elements so that the operation of the circuit is not directly or indirectly caused by a single person.

In an embodiment of the present invention, the device may include three or more pairs, wherein each pair consists of a transmitter and a receiver. The device may also include a single preventive element which is capable of preventing a transmission by one of the pairs or multiple preventive elements to prevent a transmission by each of the pairs except for one. Such an embodiment may be useful in an inventive dimmer switch or an inventive controller.

In an embodiment of such a dimmer switch, the dimmer switch may have six pairs, wherein each pair consists of a transmitter and a receiver. The dimmer switch may also have one preventive element. If a transmission between the first pair is prevented, the light may be turned off (the circuit is opened). For the remaining five pairs, if a transmission between one of the pairs is prevented, the light may be turned on if it is currently off (the circuit is closed if it is currently open) and a voltage level is applied to the light to adjust the brightness (a signal is sent over the closed circuit). The voltage level that is applied depends on which one of the five pairs had its transmission prevented. If a transmission between the second pair is prevented, a first voltage level is applied to the light. If a transmission between the third pair is prevented, a second voltage level higher than the first voltage level is applied to the light, etc. Alternatively, in an embodiment of a controller, depending on which one of the five pairs had its transmission prevented a different coded sequence may be sent over the closed circuit, for example, for sending commands to a television, a radio, a light switch or any device which is controllable either remotely or directly.

Unlike in a standard switch in which a user moves the operator to directly operate the circuit, in embodiments of the inventive device, when the user moves the operator, it typically does not directly operate the circuit. Instead, when the user moves the operator, the operator, in turn, moves the preventive element. When the processor attempts a transmission from the transmitter to the receiver the transmission is either prevented or not prevented based on the position of the preventive element. The processor then determines if the transmission was not prevented and was therefore successful. Based at least in part on whether or not the transmission is successful, the processor then directs the switch to operate the circuit. In this way, the user may be seen to only indirectly operate the circuit.

The warning indicator may issue a visual or audible alarm a fixed amount of time, x, before an attempted transmission is made and may remove the visible or audible alarm before a subsequent attempted transmission. Alternatively, the warning indicator may make the operator unusable a fixed amount of time before an attempted transmission and may make the operator usable before a subsequent transmission. In this manner, a user is informed when it is no longer safe to move the operator, since moving the operator at this time may lessen the level of indirectness between the actions of the user and the operation of the circuit.

The processor may attempt a transmission after a first delay, T. The first delay may give the user time to move a preventive element before the transmission is attempted thereby creating a further level of indirectness between the user's actions and the operation of the circuit. No transmissions are attempted except at this time. The delay may be a fixed amount of time such as zero seconds or longer. A further level of indirectness may be created if the first delay is random. The random number generator may select the length of the delay to be an amount of time between a first value and a second value. The amount of time may be selected based on a probability distribution. Subsequent attempted transmissions may be made, wherein each attempted transmission is separated by at least the first delay.

After a transmission is attempted, the random number generator may select a variable, V, at random from between a third value and a fourth value. The variable may be selected based on a probability distribution. The processor may then determine if the selected variable is above a predetermined threshold. The threshold may be either fixed or alterable. The circuit is not operated unless the variable is above the threshold (even if every other condition for operating the circuit is satisfied). The use of this variable adds an additional level of uncertainty as to whether the user's action of moving the preventive element ultimately results in the operation of the circuit. Alternatively, the variable is selected before an attempted transmission and the transmission is only attempted if the selected variable is above the threshold. The warning indicator may indicate if the variable, V, is below the threshold.

After a transmission is attempted, a second delay, D, may occur. Alternatively, the second delay may occur only before the circuit state is to be switched. The second delay may add a further level of indirectness between the user's actions and the operation of the circuit. The delay may be a fixed amount of time such as zero seconds or longer. Alternatively, the length of the delay may be generated at random by the random number generator to be an amount of time between a fifth value and a sixth value. The amount of time may be selected based on a probability distribution.

After the transmission is attempted, the processor may direct the switch to close the circuit if a first condition is satisfied or may direct the switch to open the circuit if a second condition is satisfied. The first condition and the second condition may be any logical combination of whether a transmission was successful, whether the circuit is currently opened or closed, a status of the device, or any other condition. For example, the first condition and second condition may comprise whether or not the variable, V, is above or below the threshold. Embodiments such as the wall switch depicted in FIG. 3 may have a transmitter and a receiver and a preventive element therebetween. The preventive element may remain stationary after being moved into a preventive or non-preventive position. The first condition may be that the transmission is successful and the second condition may be that the transmission is unsuccessful. Alternatively, the first condition may be that the transmission is unsuccessful and the second condition may be that the transmission is successful. Alternatively, the preventive element may not remain stationary after being moved into a preventive or non-preventive position. The first condition may be that the circuit is currently open and transmission is successful and the second condition may be that the circuit is currently closed and the transmission is successful. Alternatively, the first condition may be that the circuit is currently open and transmission is unsuccessful and the second condition may be that the circuit is currently closed and the transmission is unsuccessful.

Embodiments such as the wall switch depicted in FIG. 5 may have two pairs and a preventive element between each pair, wherein each pair consists of a transmitter and a receiver. The first preventive element may be in a preventive position such that a first transmission between the first pair will be prevented and the second preventive element may be in a non-preventive position such that a second transmission between the second pair will not be prevented. Alternatively, the first preventive element may be in a non-preventive position such that a first transmission between the first pair will not be prevented and the second preventive element may be in a preventive position such that a second transmission between the second pair will be prevented. The first condition may be that the first transmission is successful and the second transmission is unsuccessful and the second condition may be that the first transmission is unsuccessful and the second transmission is successful. Alternatively, the first condition may be that the first transmission is unsuccessful and the second transmission is successful and the second condition may be that the first transmission is successful and the second transmission is unsuccessful. As is known in the art, the logical inverse of the exemplary conditions listed above is possible as well.

In Sabbath mode, the device may employ any combination of the first delay T, the second delay D, and the variable V mentioned above. The combination employed may depend on what features have been deemed necessary to permit operation of the device on the Sabbath. In normal mode, a separate circuit may be employed which operates exactly like a conventional switch. Alternatively, the device may set the first delay T and the second delay D to zero seconds and may select the variable V such that it is always above the threshold. Using these settings would transform the function of the inventive switch to the functioning of a normal switch while still using the inventive framework.

Figure 8:
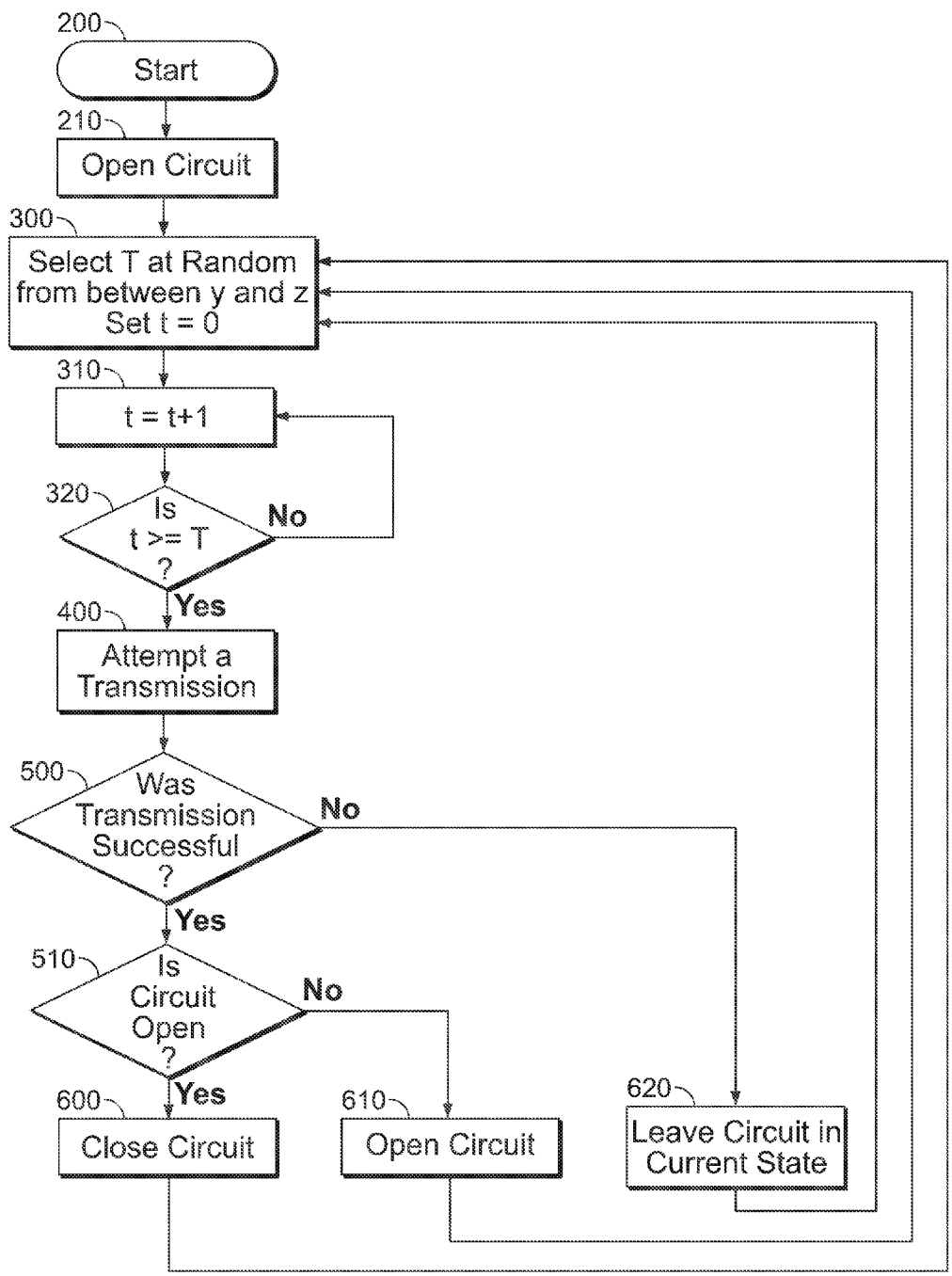
FIG. 8 shows a flowchart detailing operation of the embodiments of the present invention depicted in FIG. 3 in which the preventive element does not remain stationary after it has been moved into position.

FIG. 8 shows a flowchart detailing operation of the embodiment of the present invention depicted in FIG. 3 having one transmitter, one receiver, and one preventive element. In this embodiment, the preventive element does not remain stationary. The process starts at box 200 and proceeds to box 210 in which the circuit is opened. Alternatively, the circuit is closed in box 210. The process continues to box 300 in which a time T is selected at random from between y seconds and z seconds and a variable t is set to zero. Although, as explained above, T may alternatively be a fixed amount of time. The process continues to box 310 in which the value of the variable t is increased based on the amount of time that has transpired. The process continues to box 320 in which the processor determines whether T time has elapsed by checking if the value of t is greater than or equal to T. If T seconds have not elapsed, the process reverts back to box 310. Otherwise, the process continues to box 400 in which a transmission is attempted. The process continues to box 500 in which the processor determines whether or not the transmission was successful. The transmission was successful if the preventive element was moved to its non-preventive position and did not yet move back to its preventive position. If the transmission was unsuccessful the process continues to box 620 in which the circuit is left in its current state and then reverts to box 300. If the transmission was successful, the process continues to box 510 where the processor determines if the circuit is currently open or closed. If the circuit was open, the process continues to box 600 in which the circuit is now closed and then reverts to box 300. If the circuit was closed, the process continues to box 610 in which the circuit is now opened and then reverts to box 300.

Figure 9:
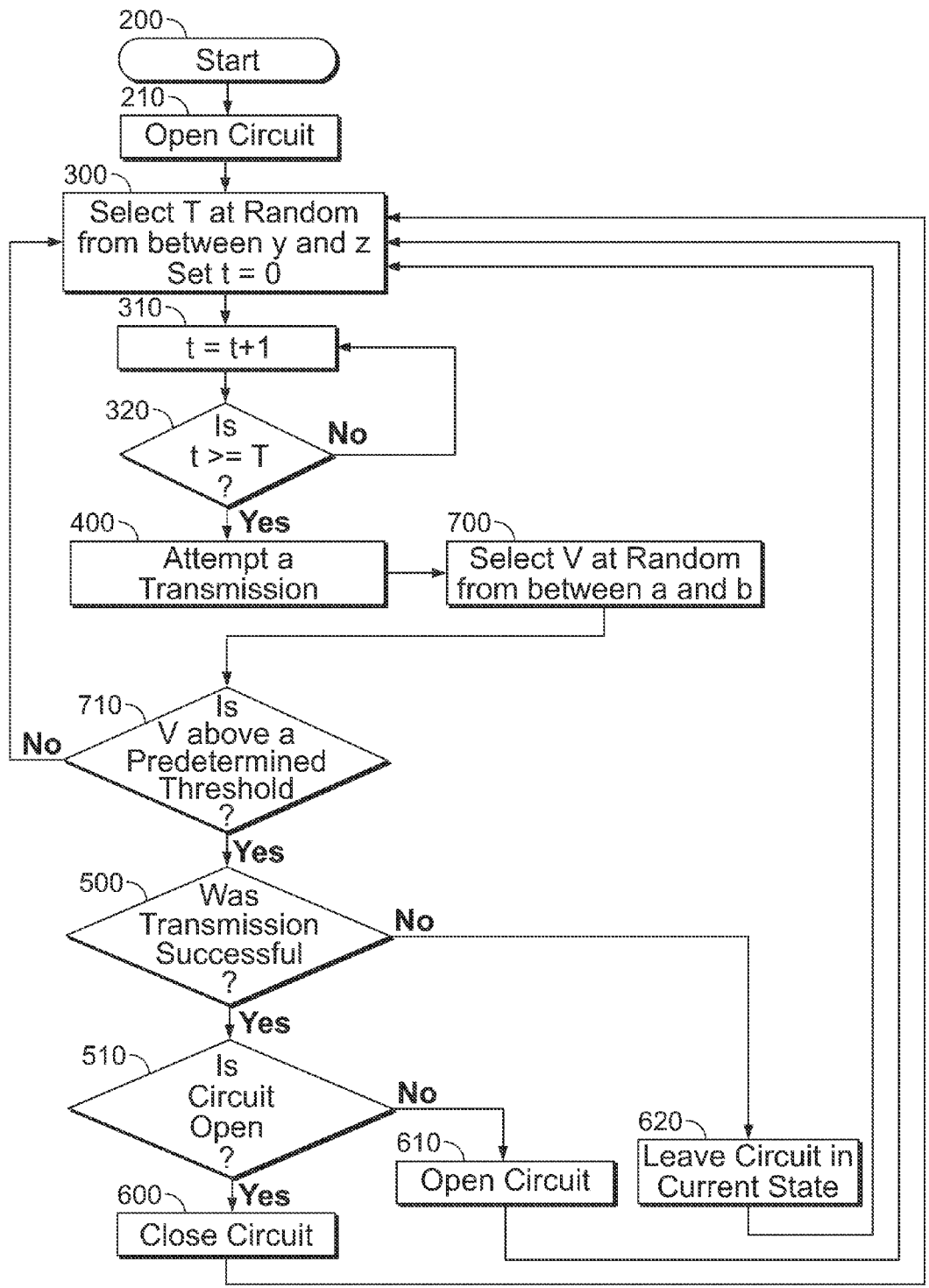
FIG. 9 shows a flowchart detailing operation of an embodiment of the present invention similar to that in FIG. 8 including the selection of a variable at random to add a level of uncertainty as to whether the user's actions will ultimately result in the operation of the circuit.

FIG. 9 shows a flowchart detailing operation of an embodiment of the present invention similar to that in FIG. 8, which includes the selection of a variable V at random to add a level of uncertainty as to whether the user's actions will result in the operation of the circuit. In the process of FIG. 9, after a transmission is attempted in box 400 the process continues to box 700. In box 700, a variable V is selected at random from between a and b using a probability distribution. The process continues to box 710 in which the processor determines whether V is above a predetermined threshold. If V is above the threshold, the process continues to box 500 as above, otherwise the process reverts to box 300. In this arrangement of process steps, even if other conditions are satisfied, the circuit is not operated unless V is above the threshold.

Figure 10:
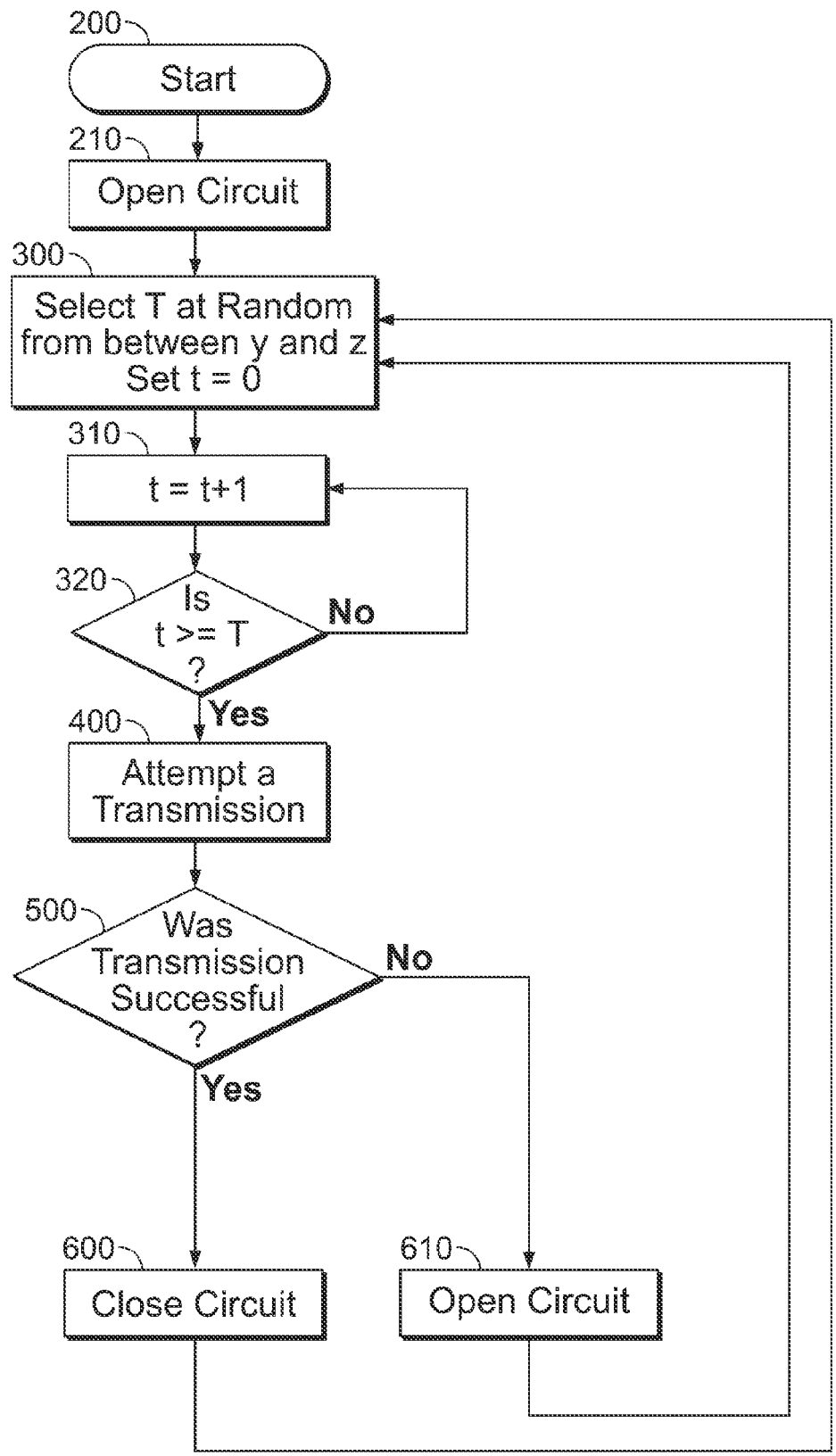
FIG. 10 shows a flowchart detailing operation of the embodiment of the present invention depicted in FIG. 3 in which the preventive element remains stationary after it has been moved into position and operation of the embodiment of the present invention depicted in FIG. 4.

FIG. 10 shows a flowchart detailing operation of the embodiment of the present invention depicted in FIG. 3 having one transmitter, one receiver, and one preventive element. In this embodiment, the preventive element remains stationary and a transmission is successful if the preventive element is in its non-preventive position. The flowchart in FIG. 10 may also detail operation of the embodiment of the present invention depicted in FIG. 4 having one receiver. In this embodiment a transmission is successful if a transmission exists and reaches the receiver. The process in FIG. 10 is identical to the process shown in FIG. 8 except that in box 500, if the transmission is successful, the process instead continues to box 600 and if the transmission is unsuccessful, the process instead continues to box 610. As mentioned above in reference to FIG. 4, additional conditions may have to be satisfied before the circuit is opened or closed. Such conditions are not shown in FIG. 10.

Figure 11:
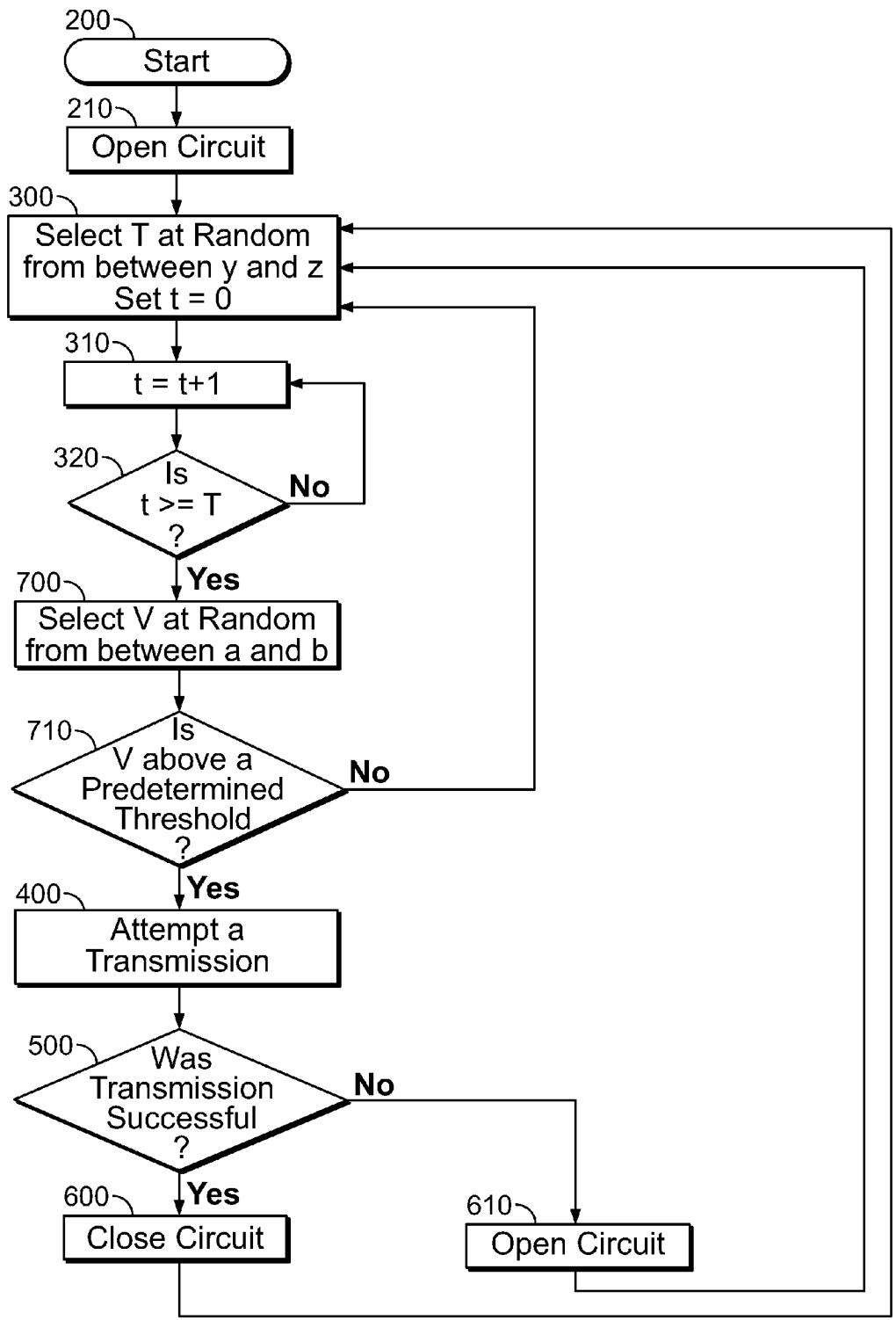
FIG. 11 shows a flowchart detailing operation of an embodiment of the present invention similar to that in FIG. 10 including the selection of a variable at random to add a level of uncertainty as to whether the user's actions will ultimately result in the operation of the circuit.

FIG. 11 shows a flowchart detailing operation of an embodiment of the present invention similar to that in FIG. 10 including the selection of a variable V at random to add a level of uncertainty as to whether the user's actions will ultimately result in the operation of the circuit. As in FIG. 9, boxes 700 and 710 are part of the process steps. As opposed to FIG. 9, boxes 700 and 710 are placed before box 400 such that a transmission is not attempted unless V is above the threshold. In this arrangement of the process steps, the end result is the same, namely, the circuit is not operated unless V is above the threshold.

Figure 12:
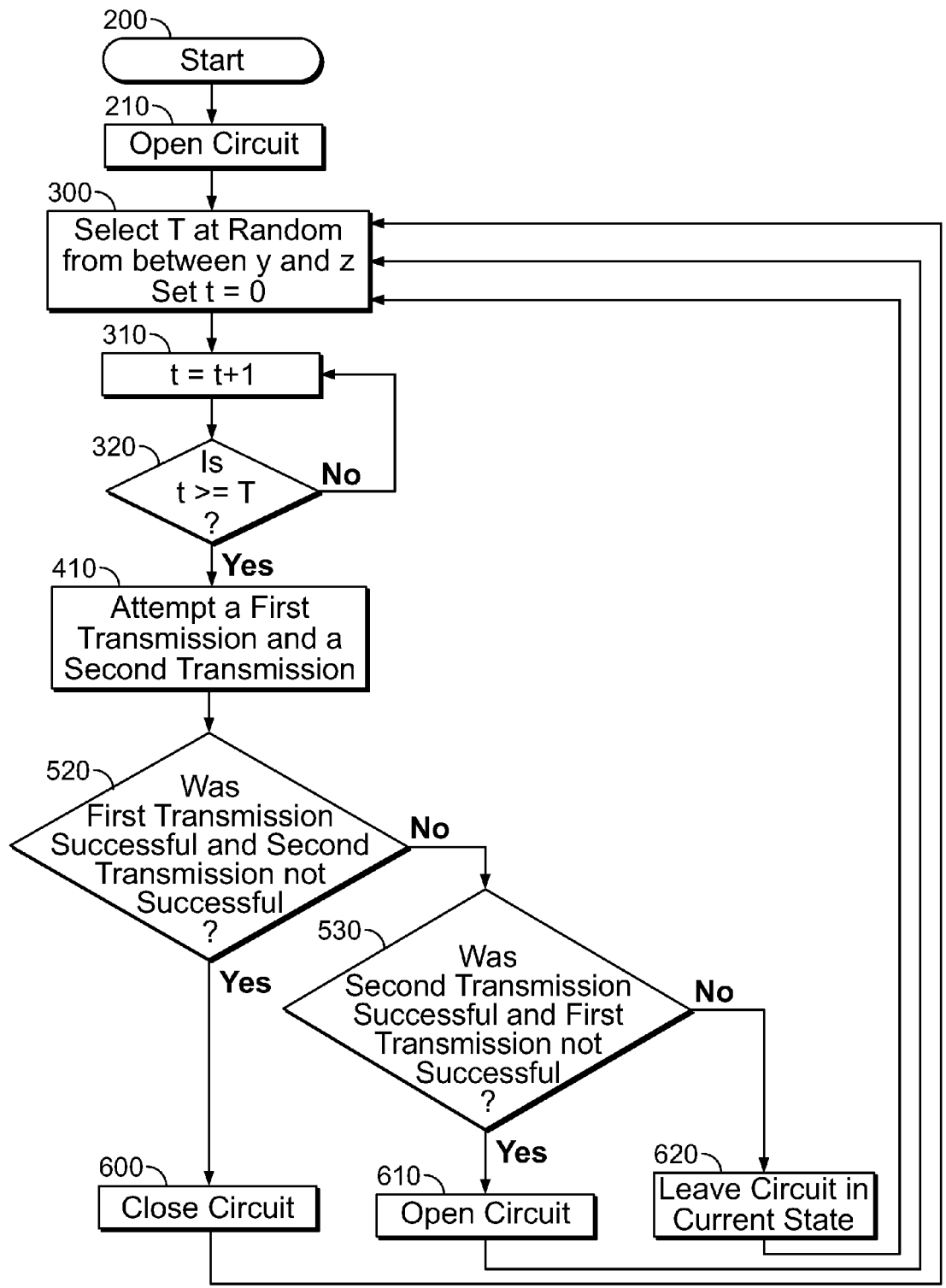
FIG. 12 shows a flowchart detailing operation of the embodiment of the present invention depicted in FIG. 5.

FIG. 12 shows a flowchart detailing operation of the embodiment of the present invention depicted in FIG. 5 having a first pair consisting of a first transmitter and a first receiver, a second pair consisting of a second transmitter and a second receiver, and a first and a second preventive element. The process of FIG. 12 is similar to that shown in FIGS. 8 and 10 except that after it is determined in box 320 that T seconds have elapsed, the process continues instead to box 410 in which a first transmission is attempted between the first pair and a second transmission is attempted between the second pair. The process then continues to box 520 in which the processor determines if the first transmission was successful and if the second transmission was unsuccessful. If both occur, the process continues to box 600. If both do not occur, the process continues to box 530 in which the processor determines if the first transmission was unsuccessful and if the second transmission was successful. If both occur, the process continues to box 610. If both do not occur, the process continues to box 620.

Figure 13A:
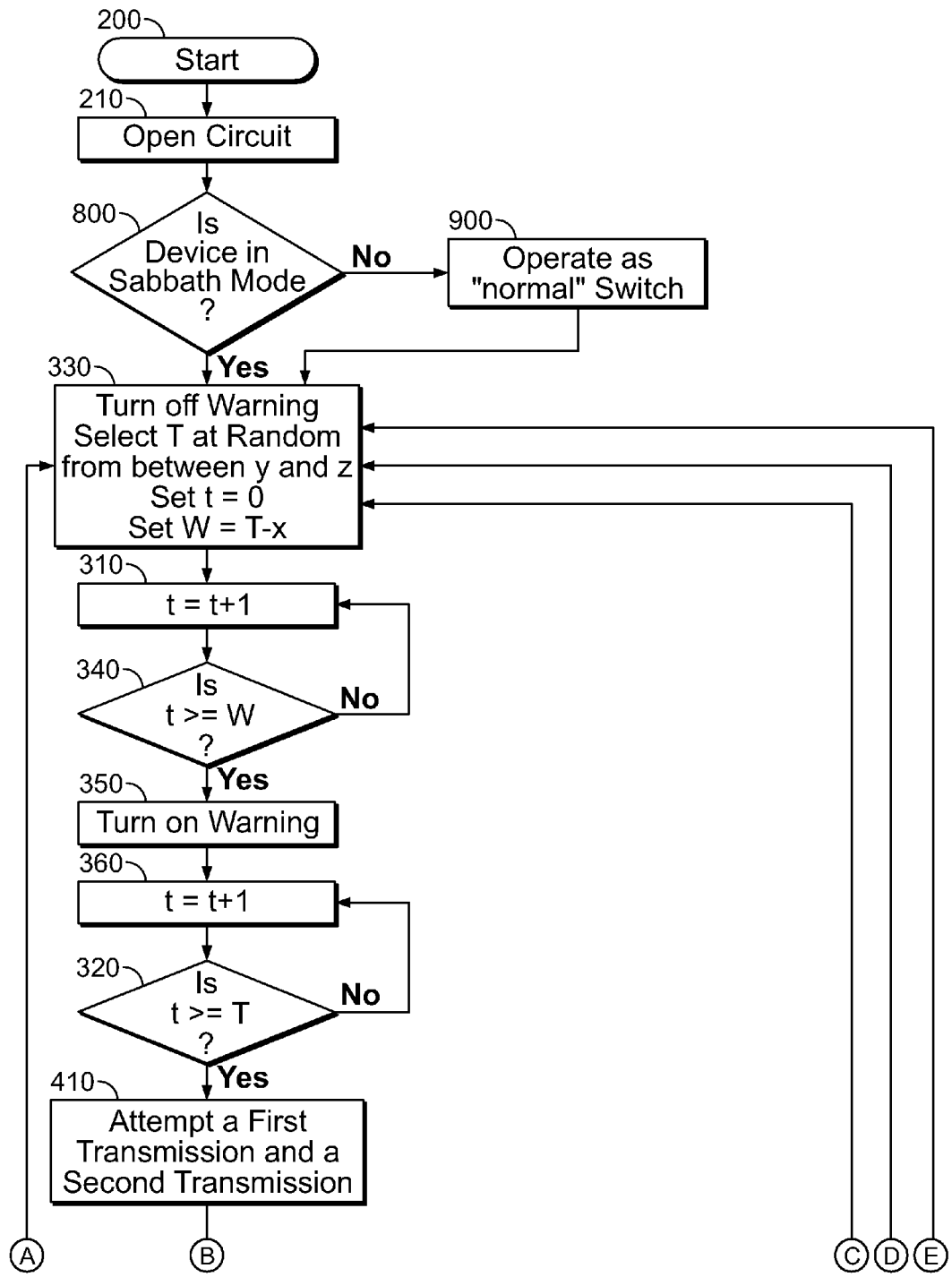
FIGS. 13A-B show a flowchart detailing operation of an embodiment of the present invention similar to that in FIG. 12 including the selection of a variable at random to add a level of uncertainty as to whether the user's actions will ultimately result in the operation of the circuit, a mode selector, a warning indicator, and an additional delay prior to operation of the circuit.
Figure 13B:
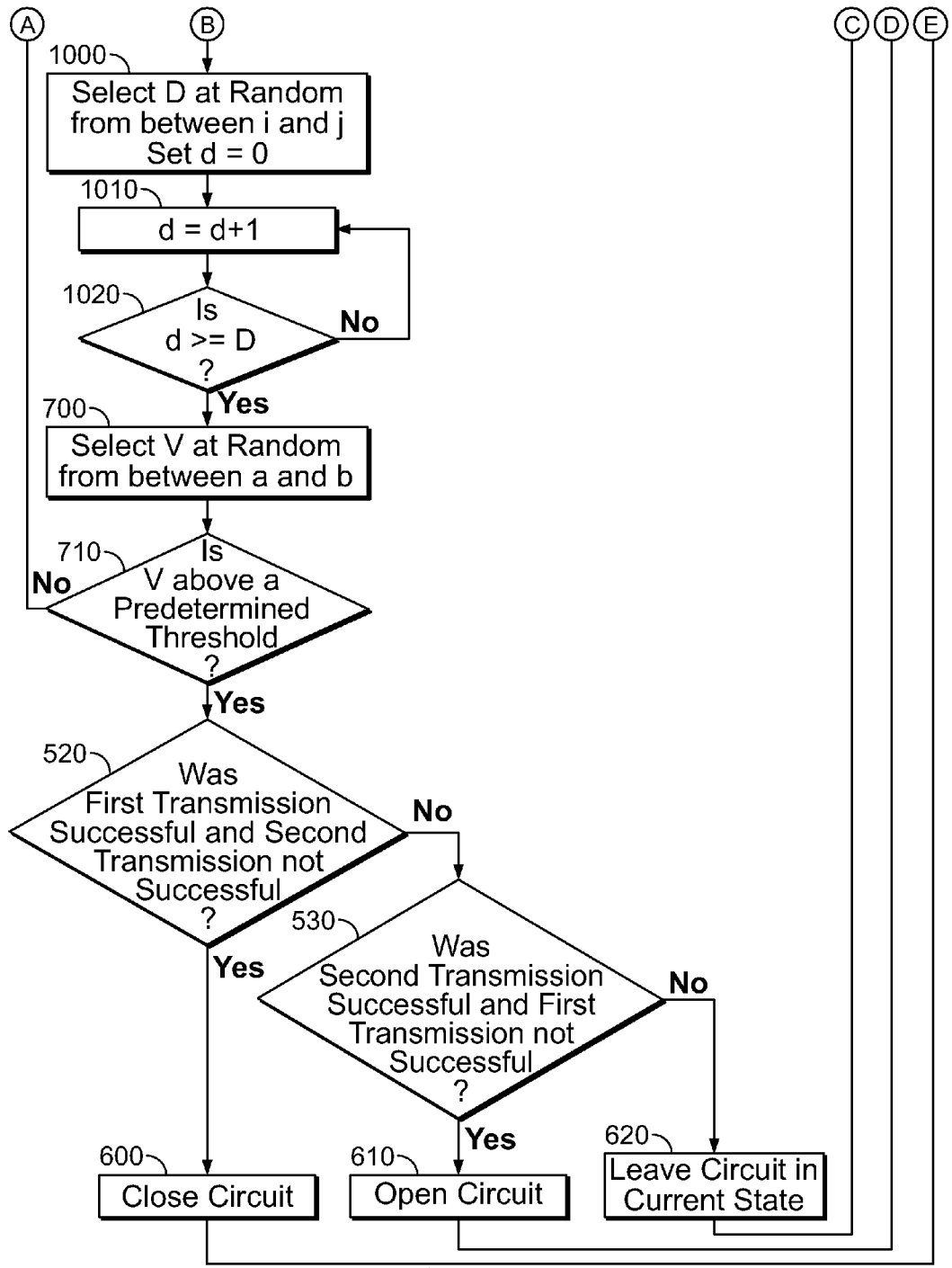

FIGS. 13A-13B show a flowchart detailing operation of an embodiment of the present invention similar to that in FIG. 12 but also including a mode selector, a warning indicator, and an additional delay prior to operation of the circuit. In FIGS. 13A-13B, after box 210, the process continues instead to box 800 in which the processor determines if the device is operating in Sabbath mode. If the device is operating in Sabbath mode, the process continues to box 330 instead of box 300. If the device is not operating in Sabbath mode, the process continues to box 900. In box 900, the device is set to work as a normal switch. This may be accomplished by setting T in box 330 and D in box 1000 to zero seconds and setting V in box 700 to be above the threshold. These settings would approximate the operation of a normal switch. In such an embodiment, the process would continue to box 330. Alternatively, a separate circuit may be engaged which operates as a normal switch in which case the process may revert back to box 800. Box 330 is identical to box 300 except that the warning indicator is shut off and a warning time W is selected to be x seconds before time T. The process continues from box 330 to box 310 in which the value of the variable t is increased based on the amount of time that has transpired and from box 310 to box 340. In box 340 the processor determines whether W time has elapsed by checking if the value of t is greater than or equal to W. If W seconds have not elapsed, the process reverts to box 310. If W seconds have elapsed, the process continues to box 350 in which the warning indicator is turned on. After box 350, the process continues to box 360 which is identical to box 310. The process continues to box 320, as before, in which the processor determines whether T time has elapsed by checking if the value of t is greater than or equal to T. If T seconds have not elapsed, the process reverts to box 360. If T seconds have elapsed, the process continues to box 410. Thus, the warning indicator is turned on x seconds before T seconds have elapsed. After box 410, the process instead continues to box 1000 in which a time D is selected at random from between i seconds and j seconds and a variable d is set to zero. Although, as explained above, D may alternatively be a fixed amount of time. The process continues to box 1010 in which the value of the variable d is increased based on the amount of time that has elapsed. The process continues to box 1020 in which the processor determines whether D time has elapsed by checking if the value of d is greater than or equal to D. If D seconds have not elapsed, the process reverts back to box 1010. Otherwise, the process continues to box 700. The rest of the process is identical to FIG. 10 except the process reverts back to box 330, not box 300, after the execution of boxes 600, 610, or 620. Additionally, because state 620 is an error condition in this embodiment (it should not be possible that both the first and second transmissions are successful or unsuccessful at any time) box 620 may further include the warning indicator indicating this error by flashing or remaining in an error state.

It is to be understood that in any of the flowcharts depicted above, certain process steps may be performed before or after other process steps without affecting the outcome of the process itself. For example, boxes 700 and 710 may be either after box 400 as in FIG. 9 or before box 400 as in FIG. 11. Furthermore, process steps that are depicted in one of the flowcharts may be incorporated into other flowcharts. For example, boxes 1000, 1010, and 1020 from FIGS. 13A-13B may be incorporated into FIG. 8.

To further clarify embodiments of the present invention, a detailed logical demonstration is presented below for a wall switch operating according to the embodiment shown in FIGS. 13A-13B. In this demonstration, when the rocker switch is down, the second transmission is successful and the first transmission is unsuccessful. When the rocker switch is up, the first transmission is successful and the second transmission is unsuccessful. In addition, the variable V is selected to always be above the threshold, the delay T is fixed at 20 seconds, x is fixed at 3 seconds, and the delay D is fixed at 1 second.

| Time | Rocker Position | Warning Indic. | First Tx | Second Tx | Circuit State | Commentary |
|---|---|---|---|---|---|---|
| 0 | Down | Green | | | Open | Initial state. |
| 17 | Down | Red | | | Open | The user sees the warning indicator turn red, and knows it is not OK to use the device. |
| 20 | Down | Red | Unsuccessful | Successful | Open | The first and second transmissions are attempted. Since the rocker switch is in the down position, the first transmission is unsuccessful and the second transmission is successful. |
| 21 | Down | Red | | | Open | After a delay of 1 second, the circuit is opened (in this case it remains open). The change in the circuit's state, based on the results of the attempted transmissions only occurs now. |
| 21+ | Down | Green | | | Open | The user sees the warning indicator turn green, and knows it is OK to use the device. |
| 32 | Up | Green | | | Open | The user pushes the plastic rocker switch into the up position. The second preventive element will prevent the second transmission and the first preventive element will not prevent the first transmission. The circuit status remains unchanged, and no electrical components within the device are affected. |
| 37 | Up | Red | | | Open | The user sees the warning indicator turn red, and knows it is not OK to use the device. |
| 40 | Up | Red | Successful | Unsuccessful | Open | The first transmission and second transmission are attempted. Since the rocker switch is in the up position, the first transmission is successful and the second transmission is unsuccessful. |
| 41 | Up | Red | | | Closed | After a delay of 1 second, the circuit is closed. The change in the circuit's state, based on the results of the attempted transmissions only occurs now. |

-continued

| Time | Rocker Position | Warning Indic. | First Tx | Second Tx | Circuit State | Commentary |
|---|---|---|---|---|---|---|
| 41+ | Up | Green | | | Closed | The user sees the warning indicator turn green, and knows it is OK to use the device. |
| 57 | Up | Red | | | Closed | The user sees the warning indicator turn red, and knows it is not OK to use the device. |
| 60 | Up | Red | Successful | Unsuccessful | Closed | The first transmission and second transmission are attempted. Since the rocker switch is in the up position, the first transmission is successful and the second transmission is unsuccessful. |
| 61 | Up | Red | | | Closed | After a delay of 1 second, the circuit is closed (in this case it remains closed). The change in the circuit's state, based on the results of the attempted transmissions only occurs now. |
| 61+ | Up | Green | | | Closed | The user sees the warning indicator turn green, and knows it is OK to use the device. |
| 65 | Down | Green | | | Closed | The user pushes the plastic rocker switch into the down position. The second preventive element will not prevent the second transmission and the first preventive element will prevent the first transmission. The circuit status remains unchanged, and no electrical components within the device are affected. |
| 77 | Down | Red | | | Closed | The user sees the warning indicator turn red, and known it is not OK to use the device. |
| 80 | Down | Red | Unsuccessful | Successful | Closed | The first transmission and second transmission are attempted. Since the rocker switch is in the down position, the first transmission is unsuccessful and the second transmission is successful. |
| 81 | Down | Red | | | Open | After a delay of 1 second, the circuit is opened. The change in the circuit's state, based on the results of the attempted transmissions only occurs now. |
| 81+ | Down | Green | | | Open | The user sees the warning indicator turn green, and knows it is OK to use the device. |

What is claimed is:

1. A method for operating a circuit, comprising:
attempting a first transmission from a first transmitter to a first receiver after a first time delay, wherein a first preventive element is adapted for moving between a preventive position and non-preventive position of said first transmission;
determining if said first transmission is successful or unsuccessful, wherein said first transmission is unsuccessful if said first preventive element prevents said first transmission by being in said preventive position, and wherein said first transmission is successful if said first preventive element does not prevent said first transmission by being in said non-preventive position;
selecting a variable at random; determining if said variable is above a predetermined threshold; and
based on said determination of if said first transmission is successful or unsuccessful, operating the circuit if said variable is determined to be above said predetermined threshold and not operating the circuit if said variable is determined to not be above said predetermined threshold.

2. The method of claim 1, wherein said operating the circuit comprises closing the circuit if said first transmission is determined to be successful and opening the circuit if said first transmission is determined to be unsuccessful.

3. The method of claim 1, wherein said operating the circuit comprises closing the circuit if said first transmission is determined to be unsuccessful and opening the circuit if said first transmission is determined to be successful.

4. The method of claim 1, wherein said operating the circuit comprises closing the circuit if the circuit is currently open and said first transmission is determined to be successful and opening the circuit if the circuit is currently closed and said first transmission is determined to be successful.

5. The method of claim 1, wherein said operating the circuit comprises closing the circuit if the circuit is currently open and said first transmission is determined to be unsuccessful and opening the circuit if the circuit is currently closed and said first transmission is determined to be unsuccessful.

6. The method of claim 1, wherein said first time delay is longer in a first mode than in a second mode.

7. The method of claim 1, further comprising: waiting a second time delay before said operating the circuit.

8. The method of claim 1, further comprising:
activating a warning before said attempted first transmission; and deactivating said warning before a subsequent attempted transmission.

9. The method of claim 1, further comprising:
attempting a second transmission from a second transmitter to a second receiver after said first time delay,
wherein a second preventive element is adapted for moving between a preventive position and non-preventive position of said second transmission; and
determining if said second transmission is successful or unsuccessful, wherein said second transmission is unsuccessful if said second preventive element prevents said second transmission by being in said preventive position, and wherein said second transmission is successful if said second preventive element does not prevent said second transmission by being in said non-preventive position, and
wherein said operating the circuit is further based on said determination of if said second transmission is successful or unsuccessful.

10. The method of claim 1, wherein said variable is less likely to be above said predetermined threshold in a first mode than in a second mode.

11. The method of claim 9, wherein said operating the circuit comprises closing the circuit if said first transmission is determined to be unsuccessful and said second transmission is determined to be successful and opening the circuit if said first transmission is determined to be successful and said second transmission is determined to be unsuccessful.

12. A device for operating a circuit, comprising:
a first transmitter;
a first receiver for receiving a first transmission from said first transmitter;
a first preventive element adapted for moving between a preventive position and non-preventive position of said first transmission;
a first random number generator for selecting a variable at random;
a processor operably coupled to said first transmitter and said first receiver for attempting said first transmission from said first transmitter to said first receiver after a first time delay and for determining if said first transmission is successful or unsuccessful and for determining if said variable is above a predetermined threshold, wherein said first transmission is unsuccessful if said first preventive element prevents said first transmission by being in said preventive position, and wherein said first transmission is successful if said first preventive element does not prevent said first transmission by being in said non-preventive position; and
a switch operably coupled to said processor for, based on said determination of if said first transmission is successful or unsuccessful, operating the circuit if said variable is determined to be above said predetermined threshold and not operating the circuit if said variable is determined to not be above said predetermined threshold.

13. The device of claim 12, wherein said operating the circuit comprises closing the circuit if said first transmission is determined to be successful and opening the circuit if said first transmission is determined to be unsuccessful.

14. The device of claim 12, wherein said operating the circuit comprises closing the circuit if said first transmission is determined to be unsuccessful and opening the circuit if said first transmission is determined to be successful.

15. The device of claim 12, wherein said operating the circuit comprises closing the circuit if the circuit is currently open and said first transmission is determined to be successful and opening the circuit if the circuit is currently closed and said first transmission is determined to be successful.

16. The device of claim 12, wherein said operating the circuit comprises closing the circuit if the circuit is currently open and said first transmission is determined to be unsuccessful and opening the circuit if the circuit is currently closed and said first transmission is determined to be unsuccessful.

17. The device of claim 12, further comprising:
a selector for switching between a first mode and a second mode, wherein said first time delay is longer in said first mode than in said second mode.

18. The device of claim 12, wherein said processor is for waiting a second time delay before said operating the circuit.

19. The device of claim 12, further comprising:
a warning device, wherein said processor is for activating said warning device before said attempted first transmission and for deactivating said warning device before a subsequent attempted transmission.

20. The device of claim 12, further comprising:
a second transmitter;
a second receiver for receiving a second transmission from said second transmitter; and
a second preventive element adapted for moving between a preventive position and non-preventive position of said second transmission,
wherein said processor is operably coupled to said second transmitter and said second receiver, and wherein said processor is for attempting said second transmission from said second transmitter to said second receiver after said first time delay and for determining if said second transmission is successful or unsuccessful, wherein said second transmission is unsuccessful if said second preventive element prevents said second transmission by being in said preventive position, and wherein said second transmission is successful if said second preventive element does not prevent said second transmission by being in said non-preventive position, and
wherein said operating the circuit is further based on said determination of if said second transmission is successful or unsuccessful.

21. The device of claim 12, further comprising:
a selector for switching between a first mode and a second mode, wherein said variable is less likely to be above said predetermined threshold in said first mode than in said second mode.

22. The device of claim 20, wherein said operating the circuit comprises closing the circuit if said first transmission is determined to be unsuccessful and said second transmission is determined to be successful and opening the circuit if said first transmission is determined to be successful and said second transmission is determined to be unsuccessful.

23. A method for operating a circuit, the method comprising:
enabling a receiver for a predetermined time after a first time delay and disabling said receiver after said predetermined time, wherein said receiver is capable of receiving ambient transmissions when enabled and is not capable of receiving ambient transmissions when disabled;
determining if an ambient transmission is successful or unsuccessful,
wherein said ambient transmission is successful if said ambient transmission is received by said receiver, and wherein said ambient transmission is unsuccessful if said ambient transmission is not received by said receiver;

selecting a variable at random;
determining if said variable is above a predetermined threshold; and
based on said determination of if said ambient transmission is successful or unsuccessful, operating the circuit if a predetermined condition related to said ambient transmission is satisfied and said variable is determined to be above said predetermined threshold and not operating the circuit if said predetermined condition is not satisfied or said variable is determined to not be above said predetermined threshold.

24. The method of claim 23, wherein said ambient transmission is selected from the group consisting of: light, heat, sound, and pressure.

25. The method of claim 23, wherein said operating the circuit comprises closing the circuit if said ambient transmission is determined to be successful and opening the circuit if said ambient transmission is determined to be unsuccessful.

26. The method of claim 23, wherein said operating the circuit comprises closing the circuit if said ambient transmission is determined to be unsuccessful and opening the circuit if said ambient transmission is determined to be successful.

27. The method of claim 23, wherein said predetermined condition is selected from the group consisting of: said ambient transmission being above a predetermined level, said ambient transmission being above said predetermined level for a predetermined time, a number of consecutive successful or unsuccessful ambient transmissions, a number of successful or unsuccessful ambient transmissions out of a larger number of ambient transmissions, and a number of successful or unsuccessful ambient transmissions within a predetermined time period.

28. The method of claim 23, wherein said first time delay is longer in a first mode than in a second mode.

29. The method of claim 23, further comprising: waiting a second time delay before said operating the circuit.

30. The method of claim 23, further comprising:
activating a warning before said enabling of said receiver; and
deactivating said warning before a subsequent enabling of said receiver.

31. The method of claim 23, wherein said variable is less likely to be above said predetermined threshold in a first mode than in a second mode.

32. A device for operating a circuit, comprising:
a receiver for receiving an ambient transmission;
a first random number generator for selecting a variable at random;
a processor operably coupled to said receiver for enabling said receiver for a predetermined time after a first time delay and disabling said receiver after said predetermined time, wherein said receiver is capable of receiving ambient transmissions when enabled and is not capable of receiving ambient transmissions when disabled;
said processor for determining if said variable is above a predetermined threshold and for determining if an ambient transmission is successful or unsuccessful, wherein said ambient transmission is successful if said ambient transmission is received by said receiver, and wherein said ambient transmission is unsuccessful if said ambient transmission is not received by said receiver; and
a switch operably coupled to said processor for, based on said determination of if said ambient transmission is successful or unsuccessful,
operating the circuit if a predetermined condition related to said ambient transmission is satisfied and said variable is determined to be above said predetermined threshold and not operating the circuit if said predetermined condition is not satisfied or said variable is determined to not be above said predetermined threshold.

33. The device of claim 32, wherein said ambient transmission is selected from the group consisting of: light, heat, sound, and pressure.

34. The device of claim 32, wherein said operating the circuit comprises closing the circuit if said ambient transmission is determined to be successful, and opening the circuit if said ambient transmission is determined to be unsuccessful.

35. The device of claim 32, wherein said operating the circuit comprises closing the circuit if said ambient transmission is determined to be unsuccessful, and opening the circuit if said ambient transmission is determined to be successful.

36. The device of claim 32, wherein said predetermined condition is selected from the group consisting of: said ambient transmission being above a predetermined level, said ambient transmission being above said predetermined level for a predetermined time, a number of consecutive successful or unsuccessful transmissions, a number of successful or unsuccessful transmissions out of a larger number of ambient transmissions, and a number of successful or unsuccessful ambient transmissions within a predetermined time period.

37. The device of claim 32, further comprising: a selector for switching between a first mode and a second mode, wherein said first time delay is longer in said first mode than in said second mode.

38. The device of claim 32, wherein said processor is for waiting a second time delay before said operating the circuit.

39. The device of claim 32, further comprising:
a warning device, wherein said processor is for activating said warning device before said enabling of said receiver and for deactivating said warning device before a subsequent enabling of said receiver.

40. The device of claim 32, further comprising:
a selector for switching between a first mode and a second mode, wherein said variable is less likely to be above said predetermined threshold in said first mode than in said second mode.

* * * * *